(12) United States Patent
Kim et al.

(10) Patent No.: US 8,481,860 B2
(45) Date of Patent: Jul. 9, 2013

(54) CONDUCTIVE PASTE CONTAINING SILVER-DECORATED CARBON NANOTUBES

(75) Inventors: Yoon-Jin Kim, Gunpo-si (KR); Chang-Mo Ko, Gwangmyeong-si (KR); Ho-Souk Cho, Seoul (KR)

(73) Assignee: LS Cable & System, Ltd, Anyang (KR)

( * ) Notice: Subject to any disclaimer, the term of this patent is extended or adjusted under 35 U.S.C. 154(b) by 30 days.

(21) Appl. No.: 13/155,341

(22) Filed: Jun. 7, 2011

(65) Prior Publication Data

US 2011/0247866 A1    Oct. 13, 2011

Related U.S. Application Data

(63) Continuation of application No. PCT/KR2009/005372, filed on Sep. 22, 2009.

(30) Foreign Application Priority Data

Dec. 10, 2008    (KR) .................. 10-2008-0125248

(51) Int. Cl.
*H05K 1/09* (2006.01)

(52) U.S. Cl.
USPC ........... 174/257; 136/256; 252/502; 252/503; 252/506; 264/2.7; 313/311; 313/495; 313/496; 427/215; 427/249.1; 428/32.72; 428/172; 429/409; 430/200; 445/46; 445/51; 502/101; 502/417

(58) Field of Classification Search
USPC ................ 174/257; 136/256; 252/502, 503, 252/506; 264/2.7; 313/311, 495, 496; 427/215, 427/249.1; 428/32.72, 172; 429/409; 430/200; 445/46, 51; 502/101, 417

See application file for complete search history.

(56) References Cited

U.S. PATENT DOCUMENTS

| | | | | |
|---|---|---|---|---|
| 7,282,260 B2 * | 10/2007 | LeGrande et al. | ............ | 428/323 |
| 7,629,293 B2 * | 12/2009 | Wu et al. | ........................ | 502/417 |
| 7,976,731 B2 * | 7/2011 | Simons | ........................ | 252/506 |
| 2002/0074932 A1 * | 6/2002 | Bouchard et al. | ............ | 313/495 |
| 2003/0077515 A1 * | 4/2003 | Chen et al. | .................. | 429/231.8 |
| 2003/0160570 A1 * | 8/2003 | Sasaki et al. | ................ | 315/169.3 |
| 2005/0061107 A1 * | 3/2005 | Hampden-Smith et al. | .... | 75/332 |
| 2005/0156504 A1 * | 7/2005 | Takai et al. | ................... | 313/495 |
| 2005/0231091 A1 * | 10/2005 | Bouchard et al. | ............ | 313/311 |
| 2006/0012281 A1 * | 1/2006 | Tai et al. | ........................ | 313/311 |
| 2006/0049741 A1 * | 3/2006 | Bouchard et al. | ............ | 313/495 |
| 2006/0057927 A1 * | 3/2006 | Kang et al. | ...................... | 445/46 |
| 2006/0066201 A1 * | 3/2006 | Ra et al. | .......................... | 313/311 |
| 2006/0175950 A1 * | 8/2006 | Itou et al. | ....................... | 313/311 |
| 2007/0037057 A1 * | 2/2007 | Douglas | ...................... | 429/231.8 |
| 2007/0057415 A1 * | 3/2007 | Katagiri et al. | ............... | 264/614 |

(Continued)

FOREIGN PATENT DOCUMENTS

| | | |
|---|---|---|
| JP | 2006-140206 | 6/2006 |
| JP | 2007-149522 | 6/2007 |
| KR | 10-2007-0059914 | 6/2007 |
| KR | 10-2008-0078397 | 8/2008 |

*Primary Examiner* — Xiaoliang Chen
(74) *Attorney, Agent, or Firm* — NSIP Law

(57) ABSTRACT

A conductive paste composition is provided. The conductive paste composition includes 20 to 70 weight % of silver nanoparticles having an average particle size of 1 nm to 250 nm based on a total weight of the conductive paste composition, and 0.01 to 2 weight % of silver-decorated carbon nanotubes based on the total weight of the conductive paste composition.

15 Claims, 5 Drawing Sheets

U.S. PATENT DOCUMENTS

| | | | |
|---|---|---|---|
| 2007/0134496 A1* | 6/2007 | Katagiri et al. | 428/408 |
| 2007/0160758 A1* | 7/2007 | Roach | 427/249.1 |
| 2008/0012163 A1* | 1/2008 | Andrews et al. | 264/2.7 |
| 2008/0014528 A1* | 1/2008 | Bailey et al. | 430/200 |
| 2008/0093968 A1* | 4/2008 | Takai et al. | 313/311 |
| 2008/0096456 A1* | 4/2008 | Yoon et al. | 445/51 |
| 2008/0220162 A1* | 9/2008 | Ko et al. | 427/215 |
| 2008/0252195 A1* | 10/2008 | Liu et al. | 313/496 |
| 2008/0295955 A1* | 12/2008 | Cawse et al. | 156/276 |
| 2009/0250106 A1* | 10/2009 | Hayashi et al. | 136/256 |
| 2010/0041544 A1* | 2/2010 | Hu et al. | 502/101 |
| 2010/0065786 A1* | 3/2010 | Simons | 252/506 |
| 2010/0092841 A1* | 4/2010 | Lopez et al. | 429/44 |
| 2010/0239794 A1* | 9/2010 | Andrews et al. | 428/32.72 |
| 2010/0247870 A1* | 9/2010 | Suzuki et al. | 428/172 |
| 2010/0277052 A1* | 11/2010 | Ra et al. | 313/346 R |
| 2010/0301278 A1* | 12/2010 | Hirai et al. | 252/502 |
| 2011/0260115 A1* | 10/2011 | Kim et al. | 252/503 |

* cited by examiner

CONDUCTIVE PASTE CONTAINING SILVER-DECORATED CARBON NANOTUBES

CROSS-REFERENCE TO RELATED APPLICATION

This application is a continuation application of International Application PCT/KR2009/005372, filed on Sep. 22, 2009, which claims the benefit of Korean Patent Application No. 10-2008-0125248, filed on Dec. 10, 2008, the entire disclosure of which is incorporated herein by reference for all purposes.

BACKGROUND

1. Field

The following description relates to a conductive paste containing silver nanoparticles, and in particular, to a conductive paste containing silver nanoparticles and silver-decorated carbon nanotubes.

2. Description of Related Art

Information communication devices, such as liquid crystal displays, are becoming more miniaturized with higher performance. Attempts have been steadily made to incorporate these devices on flexible material supports. The circuit wire of the devices is generally formed by forming a film by vapor deposition such as chemical vapor deposition (CVD), sputtering and so on, and etching out an unnecessary portion by photolithography and so on.

However, the conventional method for forming a circuit wire has disadvantages caused by repetition of film formation and etching, such as a low usage efficiency of raw materials, generation of a large amount of waste, a long manufacturing time, and a considerable installation cost. Further, the conventional method encounters many difficulties in forming a fine circuit wire required for miniaturization of the aforementioned devices.

To solve the above-referenced issues, recently, the related industries have been focusing on ink-jet printing, gravure printing, and screen printing techniques that allow a low loss of raw materials, non-use of hazardous components, such as lead or the like, and a simple process for forming a circuit wire. To form a circuit wire by these techniques, development of a high-performance conductive paste or ink is needed.

A conductive ink suitable for forming a circuit wire should have a high conductivity represented as a specific resistivity of $1 \times 10^{-5} \Omega \cdot cm$ or less. Conventionally, a conductive paste or ink was suggested to include a large amount of silver particles occupying 50 to 80% of ink weight so as to accomplish a continuous metallization. However, to form a continuous conductive network with solely silver (d=10.5 g/cm³), 75 weight % or more of silver is needed. The use of a large amount of silver produces very disadvantageous results in aspects of cost and storage stability.

Further, when printing the conductive paste on a flexible circuit board, a sufficiently low sintering temperature is important, because plastics or the like have a low glass transition temperature ($T_g$). The smaller metal particles have higher surface energy, and, accordingly, the sintering temperature tends to be even lower than an intrinsic melting point of a metal. This tendency is illustrated in FIG. 1. However, if a high content of silver particles and a reduction in particle size to a nanometer level is applied for a high conductivity and a low sintering temperature, agglomeration of silver particles is accelerated. Thus, to obtain storage stability of a conductive paste or ink, it is inevitable to use an additive such as a dispersion, a stabilizer, and so on. However, the additive increases the sintering temperature again, which was low once due to particle size reduction of silver.

SUMMARY

In one general aspect, there is provided a conductive paste composition, including 20 to 70 weight % of silver nanoparticles having an average particle size of 1 nm to 250 nm based on a total weight of the conductive paste composition, and 0.01 to 2 weight % of silver-decorated carbon nanotubes based on the total weight of the conductive paste composition.

The aspect of the conductive paste composition may further provide a solvent selected from the group consisting of ketones, alpha-terpineol, a glycol-based solvent, and an alcohol-based solvent, and a binder selected from the group consisting of acrylic resin, vinylic resin, nitrocellulose, ethylcellulose, and modified resins thereof.

The aspect of the conductive paste composition may further provide 0.1 to 10 weight % of one or more additives selected from the group consisting of a stabilizer, a dispersant, a reducing agent, a surfactant, a wetting agent, a thixotropic agent, a leveling agent, an antifoaming agent, a coupling agent, a surface tension adjusting agent, and a thickener.

The aspect of the conductive paste composition may further provide that a portion of the silver-decorated carbon nanotubes that excludes silver has an average length of 5 to 50 µm.

The aspect of the conductive paste composition may further provide that silver is physically absorbed onto surfaces of the silver-decorated carbon nanotubes.

The aspect of the conductive paste composition may further provide that the conductive paste composition has a sintering temperature of 120 to 150° C.

The aspect of the conductive paste composition may further provide that the conductive paste composition has a specific resistivity of $2 \times 10^{-6}$ to $10 \times 10^{-6} \Omega \cdot cm$.

A conductive substrate having a circuit wire formed from the conductive paste composition may be provided.

The aspect of the conductive paste composition including the solvent and the binder may further provide 0.1 to 10 weight % of at least one additive selected from the group consisting of a stabilizer, a dispersant, a reducing agent, a surfactant, a wetting agent, a thixotropic agent, a leveling agent, an antifoaming agent, a coupling agent, a surface tension adjusting agent, and a thickener.

The aspect of the conductive paste composition including the solvent and the binder may further provide that a portion of the silver-decorated carbon nanotubes that excludes silver has an average length of 5 to 50 µm.

The aspect of the conductive paste composition including the solvent and the binder may further provide that silver is physically absorbed onto surfaces of the silver-decorated carbon nanotubes.

The aspect of the conductive paste composition including the solvent and the binder may further provide that the conductive paste composition has a sintering temperature of 120 to 150° C.

The aspect of the conductive paste composition including the solvent and the binder may further provide that the conductive paste composition has a specific resistivity of $2 \times 10^{-6}$ to $10 \times 10^{-6} \Omega \cdot cm$.

A conductive substrate having a circuit wire formed from the conductive paste composition including the solvent and the binder may be provided.

Other features and aspects may be apparent from the following detailed description, the drawings, and the claims.

Figure 1:
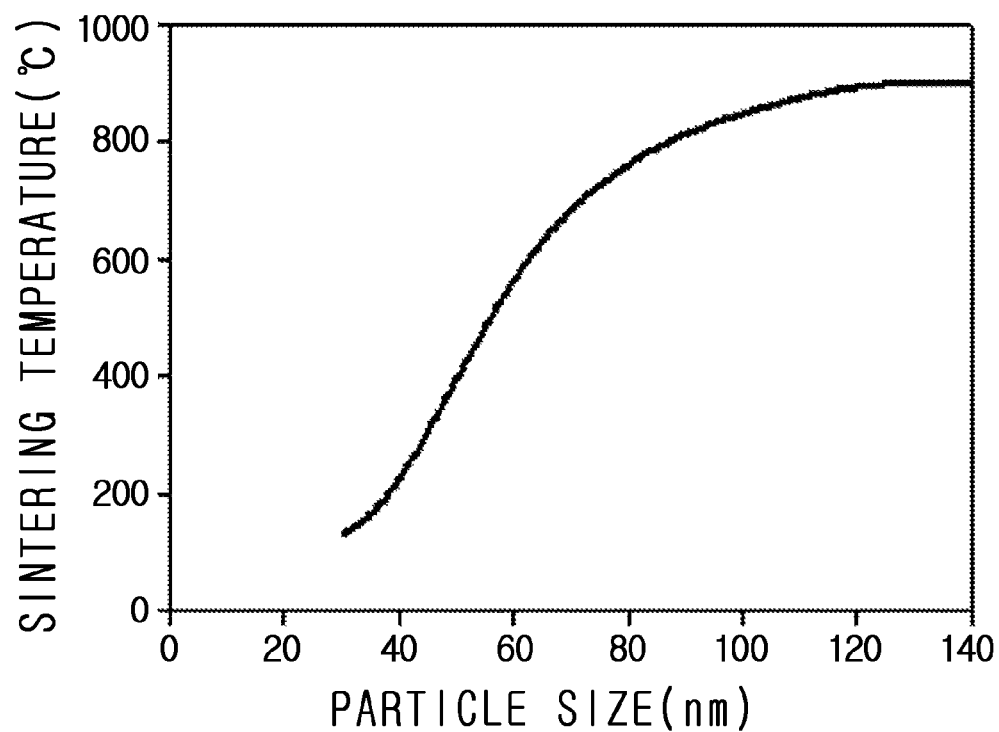
FIG. 1 is a graph illustrating an example of the correlation between a particle size of silver and a possible lowest sintering temperature of a conductive ink.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following detailed description is provided to assist the reader in gaining a comprehensive understanding of the methods, apparatuses, and/or systems described herein. Accordingly, various changes, modifications, and equivalents of the systems, apparatuses and/or methods described herein will be suggested to those of ordinary skill in the art. Also, descriptions of well-known functions and constructions may be omitted for increased clarity and conciseness.

A conductive paste or ink includes 20 to 70 weight % of silver nanoparticles having an average particle size of 1 nm to 250 nm, and 0.01 to 2 weight % of silver-decorated carbon nanotubes, based on the total weight of the conductive paste. The conductive paste or ink may further include a solvent and an additive. The conductive paste may be sintered at a temperature of 150° C. or less.

For example, the silver-decorated carbon nanotubes (CNT) are produced by physical absorption or chemical bond of silver atoms or silver ions onto the surface of single-walled or multi-walled carbon nanotubes.

Pure carbon nanotubes or carbon nanotubes with a graphene sheet, which contain a functional group on their surface in part, are added to the conductive paste containing silver, and go into the spaces between silver particles of the paste. Thus, the pure carbon nanotubes or carbon nanotubes with the graphene sheet establish an electrical connection between the silver particles or are attached to the surface of the silver particles to substantially increase the surface area of the silver particles. Accordingly, the silver-decorated carbon nanotubes may promote the forming of a conductive network.

Figure 2:
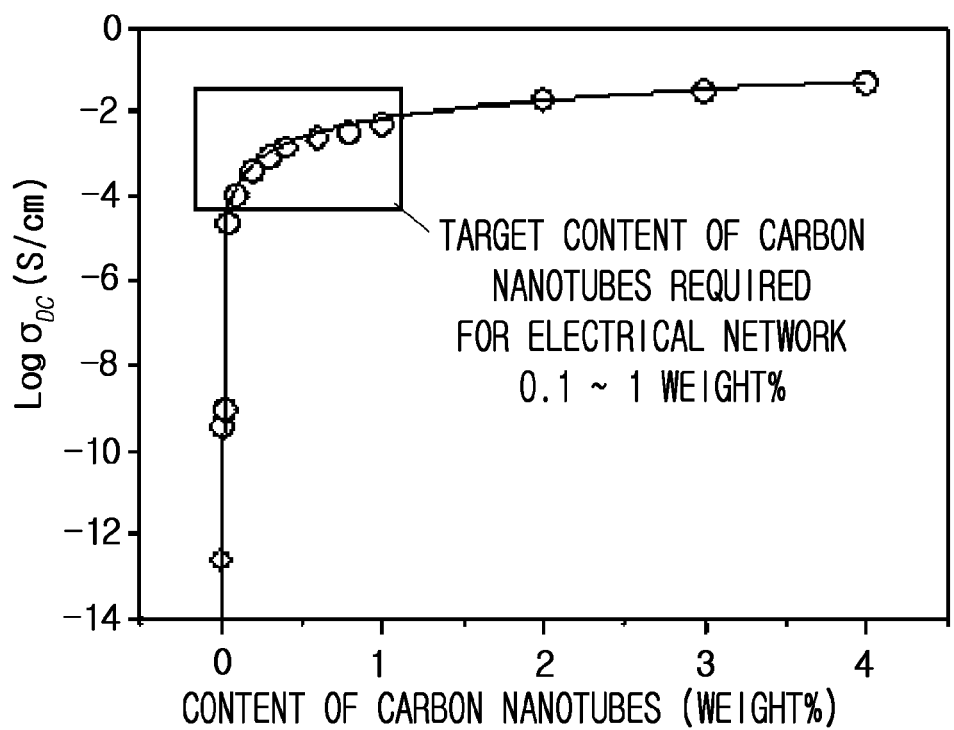
FIG. 2 is a graph illustrating an example of the electrical conductivity improvement principle when carbon nanotubes are added to a conductive ink containing silver.

This conductivity improvement principle is illustrated in FIG. 2. As is clearly seen through FIG. 2, the use of carbon nanotubes allows a reduction in silver content required to attain the same level of conductivity. For example, the content of the silver particles in the example embodiment is limited to 20 to 70 weight % to promote a desired conductivity. Even a low content of silver particles is sufficient to form an electrical network. However, the content of the silver particles may be increased for a very high conductivity, if necessary.

Pure carbon nanotubes may improve adhesion between a circuit board material and the conductive paste and control the viscosity of the conductive paste to a suitable level for printing. The typical carbon nanotubes have some extent of surface defects in a graphene sheet. Thus, a functional group, such as a carboxyl group and so on, protrudes from the surface of the defects in the manufacture. Because the pure carbon nanotubes follow this surface functional group rule, it is possible to increase the adhesion of the conductive paste to the surface of the circuit board, which is not intended to be tied to a specific theory.

However, the pure carbon nanotubes have a very high aspect ratio of 10,000 or more, and thus may cause entanglement in the conductive paste as if a skein of thread is entangled. If pure carbon nanotubes are entangled, the carbon nanotubes are not uniformly dispersed in the conductive ink, but tend to concentrate on a specific part, making it difficult to effectively connect the silver particles. When pure carbon nanotubes are not uniformly dispersed in the conductive paste, there is a difference in mechanical properties between a part where the carbon nanotubes are concentrated and a part where the carbon nanotubes do not exist. As a result, a film having an uneven circuit wire or a low leveling is formed, thereby deteriorating the reliability of end-products.

Figure 3:
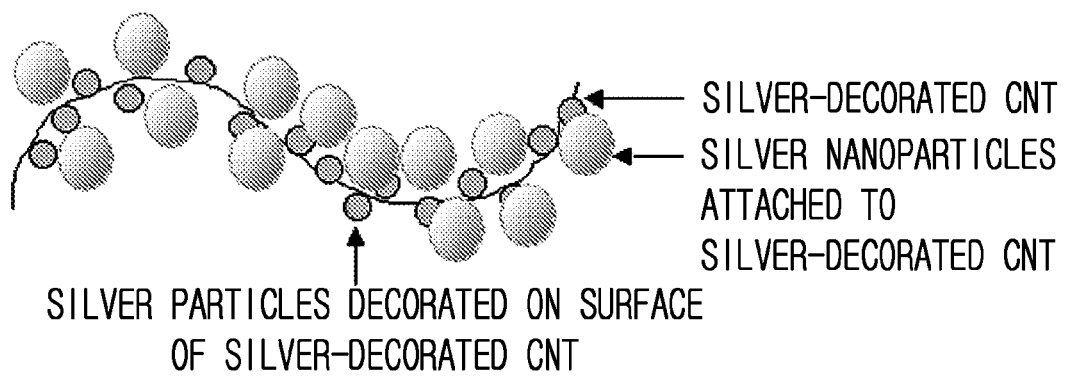
FIG. 3 is a view illustrating an example of a conductive ink containing silver-decorated carbon nanotubes (CNT) and silver nanoparticles.

However, the carbon nanotubes described herein are silver-decorated, which may serve to minimize the problems caused by use of pure carbon nanotubes and improve conductivity. As shown in FIG. 3, the silver-decorated carbon nanotubes are produced by attaching silver atoms or silver ions onto the surface of carbon nanotubes. The silver-decorated carbon nanotubes have a lower aspect ratio than pure carbon nanotubes and a reduction in entanglement. Accordingly, a separate process for dispersing carbon nanotubes may be omitted. The silver-decorated carbon nanotubes have a proper dispersion, and, thus, may have an improvement in rheological properties such as repetitive printing ability, leveling, storage stability and so on. Further, because the silver-decorated carbon nanotubes have silver on their surface, the surface area of a conductor may increase. Moreover, the silver-decorated carbon nanotubes may have a greater conductivity than carbon nanotubes without silver decoration.

The silver-decorated carbon nanotubes may occupy 0.01 to 2 weight % based on the total weight of the conductive paste. When the content of silver-decorated carbon nanotubes is in this range, the conductive ink has a high electrical conductivity, a low sintering temperature and suitable mechanical and rheological properties for screen printing. If the content of the silver-decorated carbon nanotubes is less than 0.01 weight %, it results in a poor electrical contact between silver particles, and, consequently, a large resistivity of the conductive paste. If the content of the silver-decorated carbon nanotubes is greater than 2 weight %, it results in cost rise and dispersion reduction, leading to an insignificant conductivity improvement effect. In this particular case, because a large amount of a polymer binder should be added, the sintering temperature increases.

The silver-decorated carbon nanotubes may have an average length of 5 to 50 μm, excluding a silver-decorated portion from the silver-decorated carbon nanotubes.

The conductive paste of the silver-decorated carbon nanotubes may use both single-walled nanotubes (SWNT) and multi-walled nanotubes (MWNT) as carbon nanotubes. Further, the conductive paste of the silver-decorated carbon nanotubes may use nanotubes, of which the surface is modified by various functional groups. It is proper that the carbon nanotubes have a diameter of 2 to 40 nm, excluding a silver-decorated portion.

Figure 4:
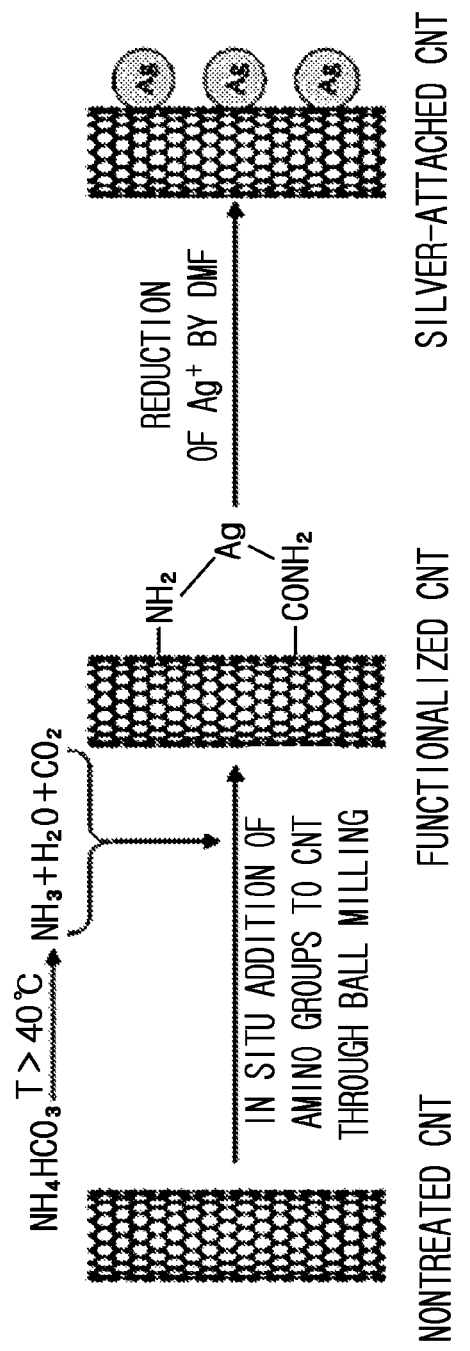
FIG. 4 is a view illustrating an example of a process for producing silver-decorated carbon nanotubes from silver ions and carbon nanotubes.

The silver-decorated carbon nanotubes used in the conductive paste may be obtained by various methods. For example, carbon nanotubes that are produced by thermal chemical vapor deposition, laser ablation, arc discharge, and so on, may be decorated with silver. A method for decorating carbon nanotubes with silver is well known in the art, and its description is made in brief. For example, (1) the carbon nanotubes may be silver-coated with silver by chemical reduction or thermal reduction. In addition, (2) the carbon nanotubes may be added while reducing a silver ion complex into silver particles. Further, (3) a silver ion complex may be formed intermediate on the surface of carbon nanotubes by attaching a functional group to the surface of the carbon nanotubes, and reducing the functionalized carbon nanotubes. The third method is illustrated in FIG. 4.

In the conductive paste, the silver nanoparticles may have an average particle size of 1 to 250 nm. If the average particle size of the silver-decorated silver nanoparticles is less than 1 nm, the conductive paste has a very low viscosity, which makes it difficult to form a predetermined thickness of circuit wire. If the average particle size is larger than 250 nm, the sintering temperature reduction effect is not great. However, the silver nanoparticles need not have an average particle size of 20 nm or less for a high conductivity and a low sintering temperature. Further, the silver nanoparticles are not limited to specific shape. The silver nanoparticles may have a shape of, for example, spherical, flake and so on. The silver nanoparticles used in the conductive paste may be used without coating or surface modification, or surface-modified for hydrophilic or hydrophobic property or surface-coated with a protective colloid forming material, and so on.

The silver nanoparticles may be included at an amount of 20 to 70 weight % based on the total weight of the conductive paste. This content is relatively lower than that of conventional pastes, and thus results in a high electrical conductivity and cost reduction. If the content of silver nanoparticles is less than 20 weight %, it results in a poor electrical contact between silver particles, leading to a large resistivity of the conductive paste. If the content of silver nanoparticles is greater than 70 weight %, it is not preferable because improvement in conductivity to cost rise is negligible.

The conductive paste containing the silver nanoparticles and the silver-decorated carbon nanotubes has a specific resistivity of $2 \times 10^{-6}$ to $10 \times 10^{-6} \Omega \cdot cm$, and a low sintering temperature of 120 to 150° C., and consequently may achieve both a high conductivity and a low sintering temperature.

In addition to the silver nanoparticles and the silver-decorated carbon nanotubes, the conductive paste may further include a binder and a solvent. Selectively, the conductive paste may further include an additive. For example, the binder may be nitrocellulose, acrylic resin, vinylic resin, ethylcellulose and modified resins thereof. The solvent and the additive may be properly selected from all typical solvents and additives depending on the desired end-use properties. For example, the solvent may be ketones such as butyl carbitol acetate, butyl acetate and so on, alpha-terpineol, a glycol-based solvent, and an alcohol-based solvent. Further, the additive may be at least one selected from the group consisting of a stabilizer, a dispersant, a reducing agent, a surfactant, a wetting agent, a thixotropic agent, a leveling agent, an antifoaming agent, a coupling agent, a surface tension adjusting agent and a thickener, and be included at an amount of 0.1 to 10 weight %.

According to another aspect, there is provided a conductive circuit board having a circuit wire formed using the conductive paste. A method of fabricating a conductive circuit board is described in brief. A circuit wire is formed by printing the conductive paste on a circuit board made of metal, glass, plastic and so on, by ink jet, spin coating, screen printing and so on. At this time, the circuit wire is formed on a base film that is formed on the surface of the circuit board. The base film of the circuit board may have a circuit pattern scanned thereon in advance by photolithography or screen printing. The conductive paste is sprayed in conformity with the scanned circuit pattern to form a film including a conductive filler. The circuit board having the conductive paste printed thereon is sintered to remove a solvent and so on, and fuse silver particles. If necessary, a multilayered circuit board may be fabricated through subsequent processes including stacking, thin-film forming, plating and so on.

Hereinafter, there is provided examples and a production method. Conductive pastes of the examples and conductive pastes of comparative examples were prepared, and their performance was compared. An example of a method of producing silver-decorated carbon nanotubes is provided. The conductive pastes of examples and comparative examples and the method of producing silver-decorated carbon nanotubes are described below.

Figure 5:
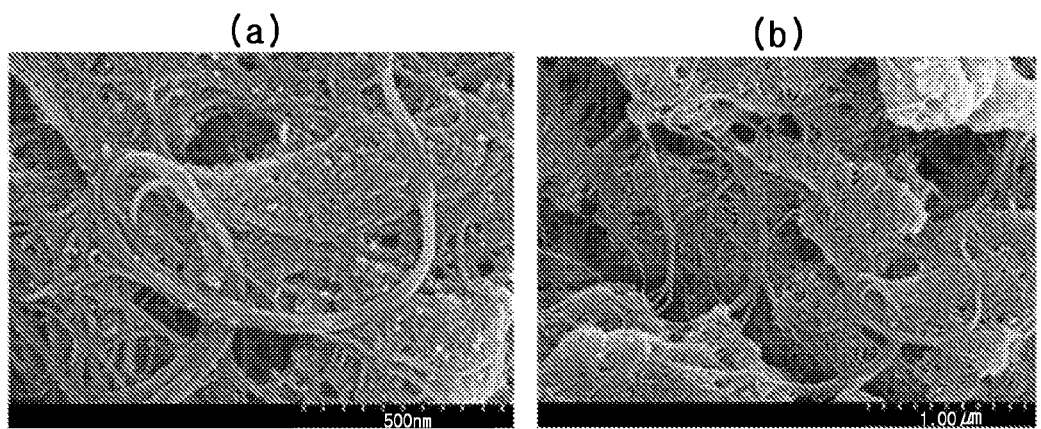
FIG. 5 is an SEM image illustrating an example of silver-decorated multi-walled carbon nanotubes produced according to example 1.

Method of Producing Silver-Decorated CNT 50 g silver nitrate was dissolved in 600 g sodium hydroxide aqueous solution, in which 50 g/L of multi-walled carbon nanotubes (diameter: 10 nm, length: tens of μm, modification and high-temperature thermal treatment, provided by Korea University) were dispersed, and 12 g $NaBH_4$ (Mw=40 g/mol) was added to reduce silver ions, so that the surface of carbon nanotubes was decorated with silver. The resultant product was filtered and thermally treated at 500° C. for one hour under an oxygen atmosphere to obtain silver-decorated CNT, in which silver was attached more stably to the surface of the carbon nanotubes. FIG. 5 shows an SEM image of the silver-decorated CNT.

EXAMPLE 1

Paste Containing Silver Nanoparticles and Silver-Decorated CNT 40 g of spherical silver nanoparticles (produced by LS Corp.) having a particle size of 5 to 40 nm, 30 g butyl acetate solution containing nitrocellulose (produced by Korea CnC Co., Ltd., RS1/2, the solid content of nitrocellulose is 10%) as a binder, and 1.5 g silver-decorated CNT obtained by the above-referenced method of producing silver-decorated CNT that was dispersed in 28.5 g butyl carbitol acetate solvent were preliminarily mixed and then mix-milled using a three roll mill such that silver particles and carbon nanotubes were sufficiently dispersed. Next, the resultant paste was printed on a PET substrate at a size of 5×5 cm by screen printing using Sus 320 (350 meshes). The substrate was sintered at 130° C. for 4 minutes in a convection oven to manufacture a specimen.

EXAMPLE 2

Paste Containing Silver Nanoparticles and Silver-Decorated CNT

A specimen was manufactured in the same way as example 1, except that 2 weight % of silver-decorated CNT was used. The substrate was sintered at 130° C. within 3 minutes. The paste had improvement in specific resistivity, compared with example 1.

EXAMPLE 3

Paste Containing Silver Nanoparticles and Silver-Decorated CNT

A specimen was manufactured in the same way as examples 1 and 2, except that 50 weight % of silver nanoparticles and 1 weight % of silver-decorated CNT were used. A sintering temperature was the same as that of example 2, but the thickness of a circuit wire and a specific resistivity were reduced as shown in Table 1.

EXAMPLE 4

Paste Containing Silver Nanoparticles and Silver-Decorated CNT

A specimen was manufactured in the same way as examples 1, 2 and 3, except that 45 weight % of silver nanoparticles and 2 weight % of silver-decorated CNT were used. A sintering temperature was lowered down to 120° C. The thickness of a circuit wire and specific resistivity were improved as shown in Table 1.

COMPARATIVE EXAMPLE 1

Paste Containing Silver Nanoparticles 70 g of spherical silver nanoparticles (produced by LG Corp.) having a particle size of 5 to 40 nm was preliminarily mixed with 30 g butyl acetate solution containing nitrocellulose (produced by Korea CnC Co., Ltd., RS1/2, the solid content of nitrocellulose is 10%) as a binder, and they were mix-milled using a three roll mill such that silver particles and carbon nanotubes were sufficiently dispersed. Next, the resultant paste was printed on a PET substrate at a size of 5×5 cm by screen printing using Sus 320 (350 meshes). The substrate was sintered at 150° C. for 4 minutes in a convection oven to manufacture a specimen.

COMPARATIVE EXAMPLE 2

Paste Containing Silver Nanoparticles and Carbon Nanotubes

A conductive ink containing silver nanoparticles was prepared in the same way as example 1, except that silver-decorated CNT was replaced by 1.5 g multi-walled carbon nanotubes (diameter: 10 nm, length: tens of μm, modification and high-temperature thermal treatment, provided by Korea University) dispersed in propylene glycol methyl ether acetate (PGMA).

Results of examples 1 to 4 and comparative examples 1 and 2 are shown in Table 1. As shown in Table 1, a conductive paste containing silver nanoparticles and silver-decorated CNT has a reduction in specific resistivity with a low content of silver, and improvement in low-temperature sintering characteristics. Further, a lower content of silver particles contributes to the reduction in thickness of a circuit wire, leading to an increase in cost reduction effect.

Table 1 shows the content of a conductive paste and thickness of a circuit wire according to examples and comparative examples.

Method for Measuring a Specific Resistivity

A specific resistivity was measured using a 4-probe tester (LORESTA-GP of Mitsubishi Chemical in Japan) according to the ASTM D 991 specifications.

TABLE 1

| | Thickness of circuit wire (μm) | Sintering temperature (° C.) | Sintering time (minutes) | Content (weight %) | | | | Specific resistance ($\Omega \cdot cm$) |
|---|---|---|---|---|---|---|---|---|
| | | | | Silver | CNT | Binder | Solvent | |
| Example 1 | 2.1 | 130 | 4 | 40 | 1.5 | 3 | 55.5 | $3.5 \times 10^{-6}$ |
| Example 2 | 2.2 | 130 | 3 | 40 | 2 | 3 | 55 | $3.1 \times 10^{-6}$ |
| Example 3 | 2.5 | 130 | 3 | 50 | 1 | 2.5 | 46.5 | $4.2 \times 10^{-6}$ |
| Example 4 | 2.2 | 120 | 3 | 45 | 2 | 2.5 | 50.5 | $3.0 \times 10^{-6}$ |
| Comparative example 1 | 3.3 | 150 | 4 | 70 | 0 | 3 | 27 | $6.7 \times 10^{-6}$ |
| Comparative example 2 | 2.3 | 150 | 4 | 40 | 1.5 | 3 | 55.5 | $5.2 \times 10^{-6}$ |

In Table 1, the conductive pastes of examples 1 to 4 contain silver-decorated carbon nanotubes produced by the above-referenced example method, and the conductive paste of comparative example 2 contains carbon nanotubes without silver decoration.

The conductive paste of comparative example 1 is a conventional conductive paste containing silver nanoparticles solely, that is, having a high content of silver particles without carbon nanotubes. The conductive paste of comparative example 1 has a specific resistivity of $6.7 \times 10^{-6} \Omega \cdot cm$ and sufficiently forms an electrical network. However, to do so, the conductive paste of comparative example 1 uses 70 weight % of silver. On the contrary, the conductive paste of comparative example 2, containing 1.5 weight % of a non-decorated carbon nanotube filler, exhibits a very good specific resistivity of $5.2 \times 10^{-6} \Omega \cdot cm$ as expected.

As mentioned above, the use of silver-decorated CNT may lead to reduction in specific resistivity and improvement in low-temperature sintering characteristics. The conductive paste of example 1 contains the same weight % of silver nanoparticles and carbon nanotubes as that of comparative example 2, but shows a smaller specific resistivity and a lower sintering temperature than that of comparative example 2. Further, the conductive pastes of examples 2 to 4 have lower sintering temperature than that of comparative example 2.

Meanwhile, the conductive paste of the examples, contrasted with those of the comparative examples, has a reduction in silver content, and consequently a reduction in thickness of a circuit wire. Accordingly, the conductive paste can reduce a usage amount of a conductive paste during printing, thereby increasing the cost reduction effect.

According to teachings above, there is provided a conductive paste that may have a low content of silver, a low specific resistivity of $1\times10^{-5}$ Ω·cm or less, and a low sintering temperature of 150° C. or less. The conductive paste may have a high conductivity by forming a continuous conductive network of silver without the need for a high content of silver particles. The conductive paste may be sintered at a low temperature.

According to teachings above, there is provided a conductive paste which may have excellent rheological properties, and thus, can be widely used to form a circuit wire, in particular, by screen printing. The conductive paste may be used to form circuit wires for printed circuit boards and display devices such as a liquid crystal display, a plasma display panel, an organic light-emitting diode and so on, to form an antenna for a radio-frequency identification (RFID) system, to produce an electrode for a solar cell, to form a reflective film for a solar cell and so on.

According to teachings above, there is provided a conductive paste which may be characterized by silver-decorated carbon nanotubes that prevent entanglement of carbon nanotubes and achieve good dispersion of carbon nanotubes, thereby eliminating the need of a separate process for dispersing the carbon nanotubes and improving the rheological properties such as flowability, storage stability and so on. The silver-decorated carbon nanotubes may establish an electrical connection between silver particles, and accomplish a continuous metallization with silver particles accumulated thereon, which leads to a higher conductivity. The conductive paste containing silver-decorated carbon nanotubes may be sintered at temperature of 150° C. or less, and may reduce the silver content so as to result in an excellent economical efficiency.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A conductive paste composition, comprising:
   20 to 70 weight % of silver nanoparticles having an average particle size of 1 nm to 250 nm based on a total weight of the conductive paste composition; and
   0.01 to 2 weight % of silver-decorated carbon nanotubes based on the total weight of the conductive paste composition,
   wherein the silver-decorated carbon nanotubes are carbon nanotubes on a surface of which silver atoms or silver ions are chemically bonded, or silver atoms or silver ions are physically absorbed.

2. The conductive paste composition according to claim 1, further comprising:
   a solvent selected from the group consisting of ketones, alpha-terpineol, a glycol-based solvent, and an alcohol-based solvent; and
   a binder selected from the group consisting of acrylic resin, vinylic resin, nitrocellulose, ethylcellulose, and modified resins thereof.

3. The conductive paste composition according to claim 1, further comprising:
   0.1 to 10 weight % of one or more additives selected from the group consisting of a stabilizer, a dispersant, a reducing agent, a surfactant, a wetting agent, a thixotropic agent, a leveling agent, an antifoaming agent, a coupling agent, a surface tension adjusting agent, and a thickener.

4. The conductive paste composition according to claim 1, wherein a portion of the silver-decorated carbon nanotubes that excludes silver has an average length of 5 to 50 μm.

5. The conductive paste composition according to claim 1, wherein silver is physically absorbed onto surfaces of the silver-decorated carbon nanotubes.

6. The conductive paste composition according to claim 1, wherein the conductive paste composition has a sintering temperature of 120 to 150° C.

7. The conductive paste composition according to claim 1, wherein the conductive paste composition has a specific resistivity of $2\times10^{-6}$ to $10\times10^{-6}$ Ω·cm.

8. A conductive substrate having a circuit wire formed from the conductive paste composition according to claim 1.

9. The conductive paste composition according to claim 2, further comprising:
   0.1 to 10 weight % of at least one additive selected from the group consisting of a stabilizer, a dispersant, a reducing agent, a surfactant, a wetting agent, a thixotropic agent, a leveling agent, an antifoaming agent, a coupling agent, a surface tension adjusting agent, and a thickener.

10. The conductive paste composition according to claim 2, wherein a portion of the silver-decorated carbon nanotubes that excludes silver has an average length of 5 to 50 μm.

11. The conductive paste composition according to claim 2, wherein silver is physically absorbed onto surfaces of the silver-decorated carbon nanotubes.

12. The conductive paste composition according to claim 2, wherein the conductive paste composition has a sintering temperature of 120 to 150° C.

13. The conductive paste composition according to claim 2, wherein the conductive paste composition has a specific resistivity of $2\times10^{-6}$ to $10\times10^{-6}$ Ω·cm.

14. A conductive substrate having a circuit wire formed from the conductive paste composition according to claim 2.

15. The conductive paste composition according to claim 1, wherein the silver-decorated carbon nanotubes are single-walled carbon nanotubes on a surface of which silver atoms or silver ions are chemically bonded or silver atoms or silver ions are physically absorbed.

* * * * *